United States Patent [19]
Brown

[11] Patent Number: 5,218,513
[45] Date of Patent: Jun. 8, 1993

[54] PLENUM FOR AIR-IMPINGEMENT COOLING OF ELECTRONIC COMPONENTS

[75] Inventor: David W. Brown, Bellingham, Mass.

[73] Assignee: Digital Equipment Corporation, Maynard, Mass.

[21] Appl. No.: 924,733

[22] Filed: Aug. 4, 1992

[51] Int. Cl.$^5$ .............................................. H05K 7/20
[52] U.S. Cl. ...................................... 361/384; 361/381
[58] Field of Search ............................. 174/15.1, 16.1; 361/381–385

[56] References Cited

U.S. PATENT DOCUMENTS

| | | | |
|---|---|---|---|
| 4,498,118 | 2/1985 | Bell | 361/384 |
| 4,674,004 | 6/1987 | Smith et al. | 361/384 |

FOREIGN PATENT DOCUMENTS 0028896 1/1989 Japan ................................. 361/384

Primary Examiner—Gregory D. Thompson
Attorney, Agent, or Firm—Cesari and McKenna

[57] ABSTRACT

An electronic circuit assembly (10) including circuit boards (14, 16 and 18) includes a plenum (22) disposed adjacent the components (38 and 40) on the circuit boards for directing air from a blower (18) selectively onto the components (38 and 40). Struts (34, 34', and 82) extending between the plenum's face walls (24, 26) prevent excessive bowing of those walls under the pressure caused by the blower (18). As a consequence, the plenum can be made of material that is relatively thin and light.

4 Claims, 3 Drawing Sheets

PLENUM FOR AIR-IMPINGEMENT COOLING OF ELECTRONIC COMPONENTS

BACKGROUND OF THE INVENTION

The present invention is directed to electronic circuitry and in particular to cooling it.

The operation of certain types of electronic circuitry, particularly circuits of the type intended to operate at very high speeds, depends to an extent on the positioning of circuit components on the circuit boards in which the circuitry is embodied. It thus is often desirable to be able to position the components in such a way as to maximize, say, the speed of which the circuit is capable. But the positions that would be most desirable from a speed standpoint sometimes cannot be adopted in practice, because to do so would make it difficult to cool the circuitry properly by ordinary fan cooling.

To reduce such component-positioning constraints, it has been proposed to use a cooling arrangement of the type described, for instance, in U.S. Pat. No. 4,498,118 to Bell, in which a generally planar cooling module, more or less in the shape of a circuit board, is disposed to face the circuit board's component surface. The cooling module has an internal plenum that forms openings opposite individual, targeted components on the circuit board, and air flowing through the plenum is thereby directed preferentially to the components most in need of cooling. Air directed to a given component thus is not subjected to heating by "upstream" components, and the circuit designer is thus afforded greater freedom in component positioning.

This approach has not been widely adopted, though, presumably because such a plenum adds considerable weight and some cost to the circuit assembly.

SUMMARY OF THE INVENTION

I have recognized that the weight and expense of the air-directing plenum can be greatly reduced by providing internal struts in the plenum chamber that extend between the plenum's face walls and prevent them from bowing excessively under the pressure that results from the air flow. By employing this approach, acceptable rigidity can be achieved in a plenum that is light and inexpensive enough for widespread use.

BRIEF DESCRIPTION OF THE DRAWINGS

These and further features and advantages of the present invention are described below in connection with the accompanying drawings, in which.

DETAILED DESCRIPTION OF AN ILLUSTRATIVE EMBODIMENT

Figure 1:
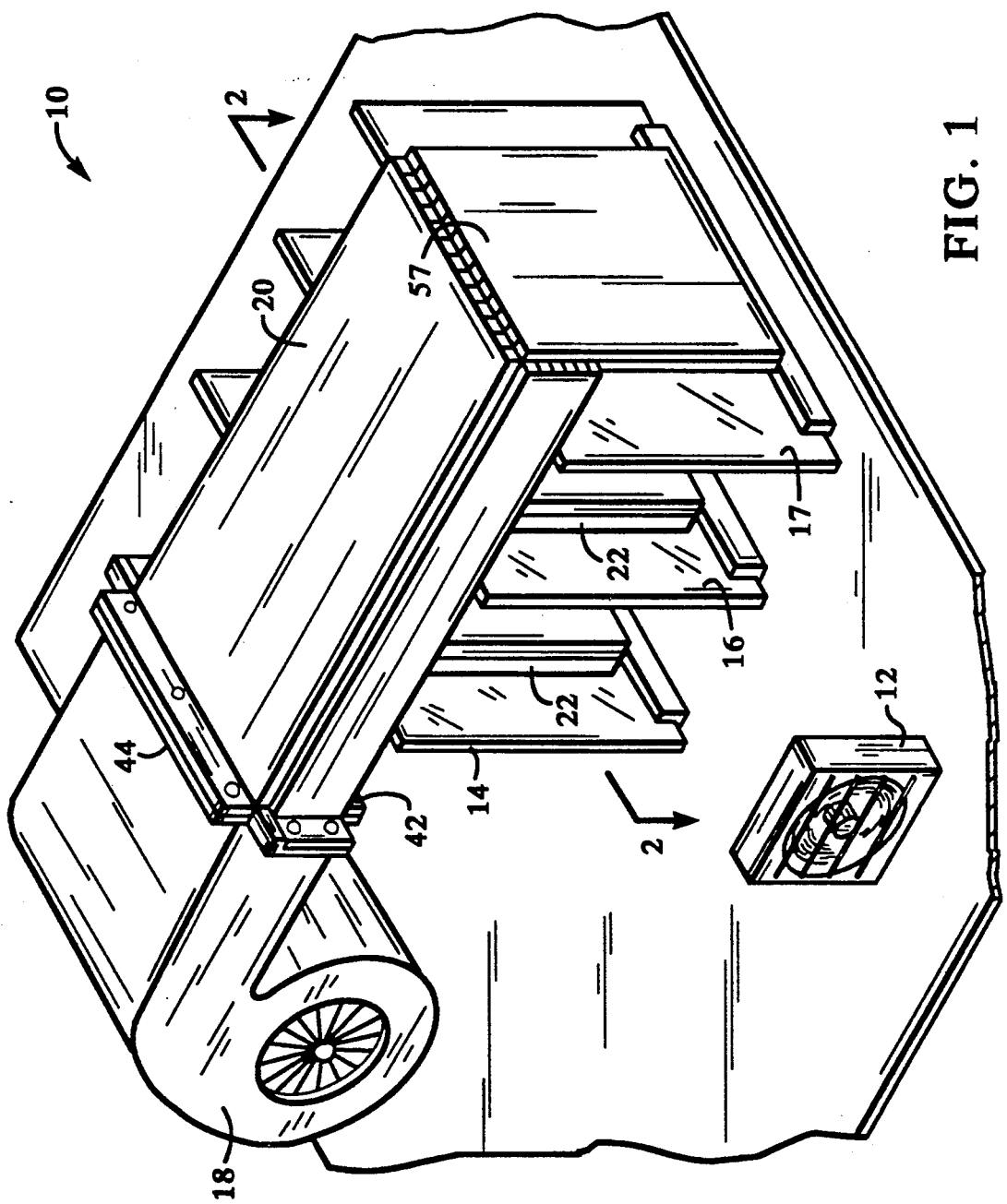
FIG. 1 is an isometric view of an electronic-circuit assembly that employs the teachings of the present invention.

A circuit assembly 10 in FIG. 1 of the type to which the teachings of the present invention can be applied may include a blower 12 for blowing cooling air through a plurality of circuit boards 14, 16, and 17 in the usual manner. In accordance with the present invention, a blower 18 is provided in addition to, or instead of, blower 12 in order to direct cooling air especially to specific components on boards 14, 16, and 17. Blower 18 blows air into a manifold 20 from which the cooling air reaches the circuit board by means of generally planar plenum members 22.

Figure 2:
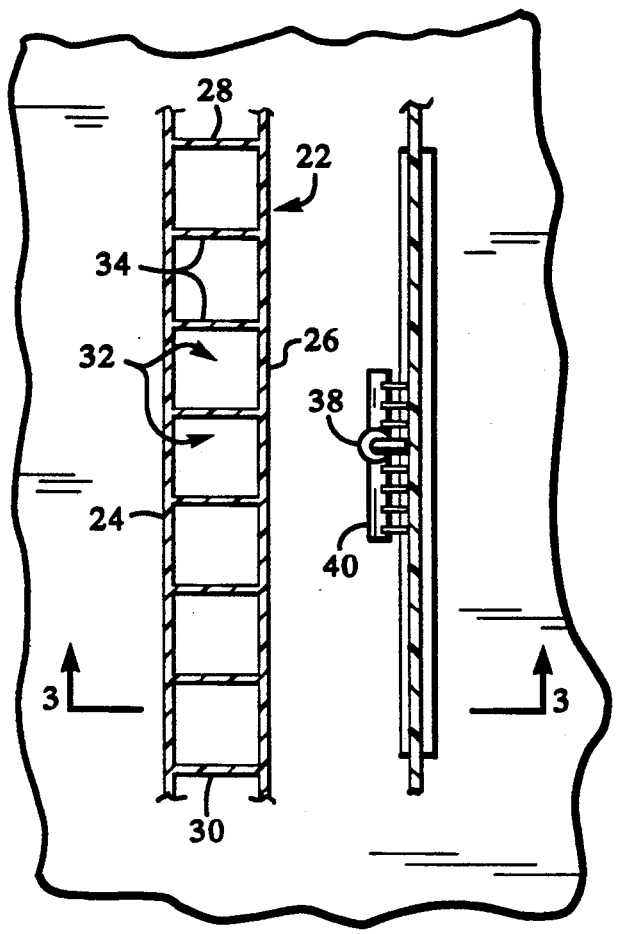
FIG. 2 is a cross section of the plenum and adjacent circuit boards of the assembly taken at line 2—2 of FIG. 1.

Because of the assembly approach described below, each plenum member is provided in two layers, of which FIG. 2 depicts only one. FIG. 2 shows that the plenum member 22 includes face walls 24 and 26 and end walls 28 and 30 that together define an interior chamber 32 through which blower 18 can drive air. According to the present invention—and formed integrally with the walls in the illustrated embodiment—are struts 34 that extend between the face walls 24 and 26 and limit the spacing between them. In the illustrated embodiment, the struts and face walls are of the same material and thickness, but this is not a necessary feature of the invention; the purpose of the end walls is to form a chamber with the face walls 24 and 26, while that of the struts 34 is, as was just explained, to hold the face walls together.

Figure 3:
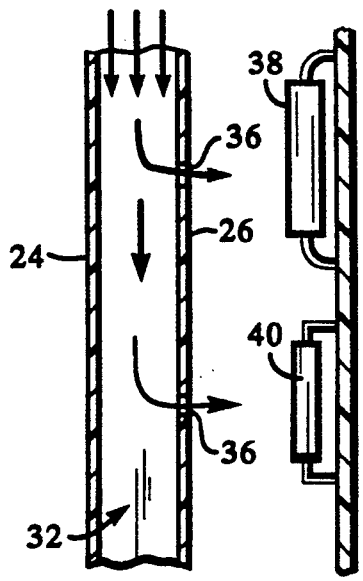
FIG. 3 is a cross-sectional view taken at line 3—3 of FIG. 2.

As FIG. 3 shows, the face walls 24 and 26 form openings 36 by which air forced through chamber 32 can be expelled directly onto circuit components 38 and 40 to be cooled. As a consequence, component 40, which might otherwise be prevented from being located as shown because its position immediately "downstream" of component 38 would prevent its properly being cooled, can be so positioned because air reaching it from the opening 36 has not been heated by the otherwise "upstream" component 38.

Because of the present invention, the plenum member 22 can be made of thin, light material. It may, for instance, be extruded from high-density polyethylene having walls that are only, say, 0.005 inch (0.013 cm) thick because the struts 34 limit the extent to which the face walls 24 and 26 can be bowed by the pressure difference across them. As a consequence, the plenum member retains its shape despite air flow great enough to cause a pressure difference that exceeds 10 psi ($7 \times 10^5$ dynes/cm$^2$). Without the struts, of course, the face walls would bow unacceptably under such pressure.

Figure 4:
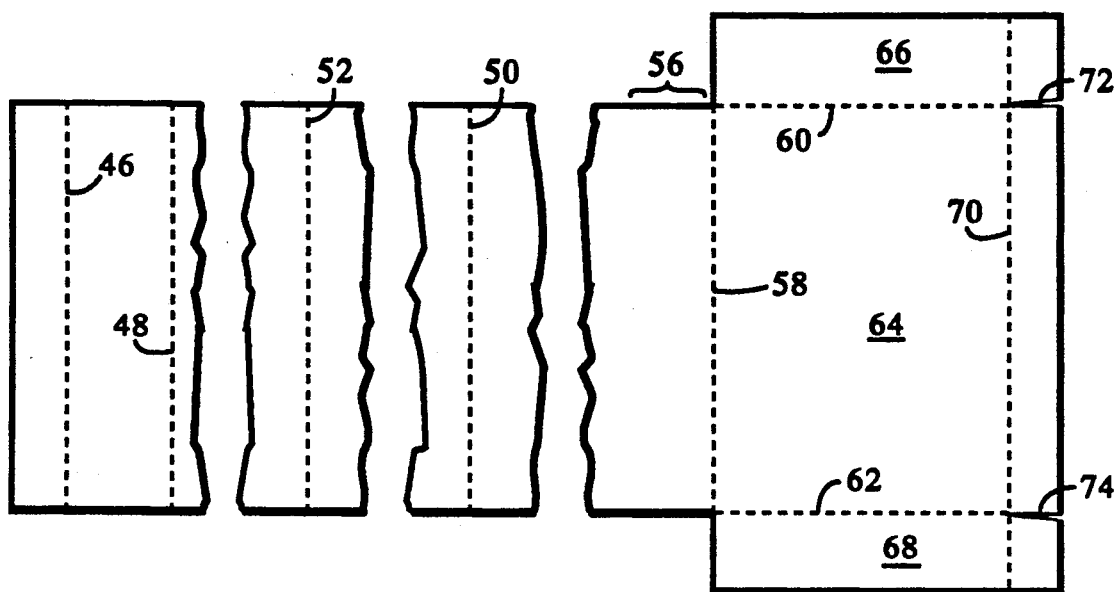
FIG. 4 is a plan view of a blank of extruded plastic board employed to form the manifold and plenum members in the assembly of FIG. 1.

Extruded plastic board of this type, which is often used for various types of packaging, is inexpensive and lends itself readily to formation into the manifold as well as the various plenum members. For example, a blank of such material shaped as shown in FIG. 4 might be used to form the manifold and a plurality of plenum members. A portion 42 (FIG. 1) of a manifold flange that mates with a blower flange 44 is formed by cutting through the upper wall and struts along dashed lines 46

Figure 6:
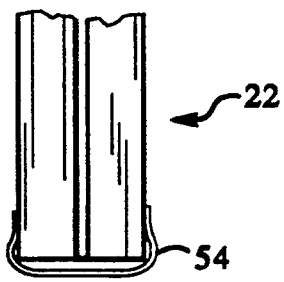
FIG. 6 is a detailed elevation of the end portion of a plenum member of the electronic-circuit assembly of FIG. 1.
Figure 5:
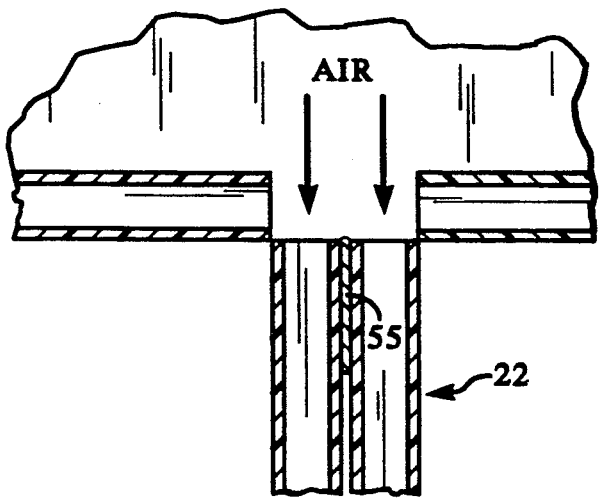
FIG. 5 is a detailed cross-sectional view of the junction between a plenum member and the manifold in the assembly of FIG. 1.
Figure 7:
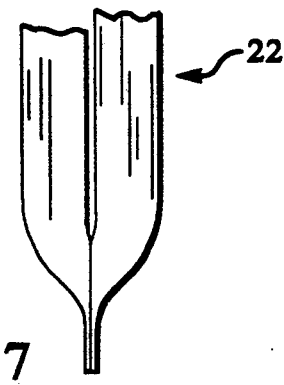
FIG. 7 is a view similar to FIG. 6 of an alternate embodiment of the present invention.

(FIG. 4) but leaving the lower wall and bending it at that line. By similarly scoring through the upper wall and struts at dashed lines 48 and 50 and scoring through the lower wall and struts at dashed line 52, one can form a plenum member 22, as can be appreciated by referring to FIGS. 5 and 6, which respectively depict the upper and lower ends of the plenum member 22 in detail. FIG. 6 shows that the end of the (two-layer) plenum member 22 is stopped with tape 54, but the ends might, for instance, be heat welded instead, as FIG. 7 depicts. The plenum-layer tops, too, are preferably secured together, such as by glue 55 (FIG. 5), to reduce air leakage from between the plenum layers and to add structural rigidity.

The part of the blank that forms the second side of the last plenum member is extended upward by an extra length 56 to form the end wall 57 (FIG. 1) of the manifold, and the blank is scored through the bottom face and struts at dashed lines 58, 60, and 62 to form the upper wall 64 of the manifold as well as its side walls 66 and 68. To form the remaining flange portions, the blank is scored through the upper face and struts at dashed lines 70 and cut all the way through at 72 and 74.

The resulting structure may be taped or heat welded together at its joints to minimize pressure loss, and the manifold may itself be provided with struts in the form of rivets (not shown) whose purpose is to prevent bowing in the manifold walls, just as the struts 34 integrally formed in the board prevent plenum-wall bowing.

As was mentioned above, the purpose of the struts is to prevent excessive bowing. With thin enough material and high enough pressure, some bowing may occur between the struts, but the struts insure that the overall shape, while having some surface undulation, retains the desired generally planar shape.

Figure 8:
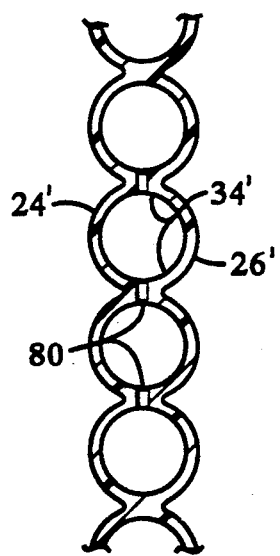
FIG. 8 is a cross-sectional view of the plenum from another alternate embodiment of the present invention.

Indeed, some embodiments of the present invention might begin with a shape having such undulations, as FIG. 8 illustrates. In the plenum member of FIG. 8, the face walls 24' and 26' are formed at the time of manufacture with a shape that is bowed between the struts 34', which, because of the generally arcuate shapes of the face-wall sections, are only vestigial in comparison with the corresponding struts 34 of FIG. 2.

In most cases, the plenum will be formed by extrusion, and the openings opposite the electronic components will be provided by appropriate drilling afterward. In such cases, the struts 34' would ordinarily extend the length of the plenum. But it may sometimes be desirable for interruptions in the struts such as holes 80 to be provided in order to keep air flow even.

Figure 9:
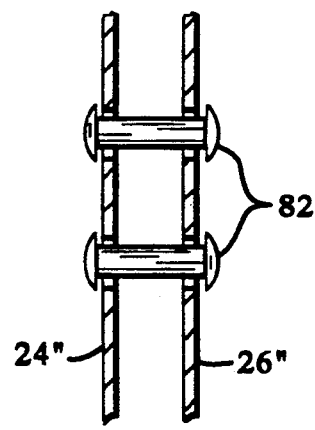
FIG. 9 is a sectional view of a plenum from yet another alternate embodiment of the present invention.

FIG. 9 depicts an alternative embodiment that achieves a similar result. Rivets 82 are installed through holes in the face walls 24" and 26" to hold the face walls together. The FIG. 8 and FIG. 9 arrangements both permit fluid communication among all regions of the interior chamber and thus tend to equalize pressure.

It is clear that providing such struts in the plenums enables one greatly to reduce the weight and cost associated with providing plenums that direct air to specific components. The present invention thus constitutes a significant advance in the art.

What is claimed is:

1. An electronic-circuit assembly including:
    A) a generally planar circuit board;
    B) a plurality of electronic components mounted on the circuit board;
    C) a plenum including generally opposed face walls and end walls extending therebetween to form a coolant-flow chamber and further including struts disposed in the chamber, extending between the face walls, and holding them together, at least one of the face walls forming openings in registration with respective ones of the electronic components by which cooling fluid can flow from the chamber to the respective electronic components; and
    D) means for causing cooling fluid to flow through the chamber and out the openings.

2. An electronic-circuit assembly as defined in claim 1 wherein the plenum member is made of an extruded plastic material.

3. An electronic-circuit assembly as defined in claim 2 wherein the struts are formed integrally with the face walls.

4. An electronic-circuit assembly as defined in claim 1 wherein the struts are formed integrally with the face walls.

* * * * *